United States Patent [19]
Komenaka et al.

[11] Patent Number: 5,276,352
[45] Date of Patent: Jan. 4, 1994

[54] RESIN SEALED SEMICONDUCTOR DEVICE HAVING POWER SOURCE BY-PASS CONNECTING LINE

[75] Inventors: Kazuichi Komenaka, Kawasaki; Toshimitsu Ishikawa, Kawaguchi, both of Japan

[73] Assignee: Kabushiki Kaisha Toshiba, Kawasaki, Japan

[21] Appl. No.: 22,761

[22] Filed: Feb. 22, 1993

Related U.S. Application Data

[63] Continuation of Ser. No. 790,525, Nov. 12, 1991, abandoned.

[30] Foreign Application Priority Data

Nov. 15, 1990 [JP] Japan .................. 2-307023

[51] Int. Cl.⁵ .................. H01L 23/48; H01L 23/12
[52] U.S. Cl. .................. 257/666; 257/668; 257/787
[58] Field of Search .................. 357/70, 72, 74

[56] References Cited

U.S. PATENT DOCUMENTS

| | | | |
|---|---|---|---|
| 4,595,945 | 6/1986 | Graver | 357/70 |
| 4,612,564 | 9/1986 | Moyer | 357/70 |
| 4,934,820 | 6/1990 | Takahashi et al. | 357/70 |

FOREIGN PATENT DOCUMENTS

| | | |
|---|---|---|
| 59-100550 | 6/1984 | Japan . |
| 61-248456 | 11/1986 | Japan . |
| 63-52457 | 3/1988 | Japan . |
| 63-052458 | 3/1988 | Japan . |
| 63-253635 | 10/1988 | Japan . |
| 63-255953 | 10/1988 | Japan . |
| 2-143449 | 6/1990 | Japan . |

*Primary Examiner*—Eugene R. LaRoche
*Assistant Examiner*—Viet Q. Nguyen
*Attorney, Agent, or Firm*—Foley & Lardner

[57] ABSTRACT

A resin sealed semiconductor device having: a semiconductor chip having an electric circuit therein and an elongated main connection line respectively formed thereon; a plurality of leads disposed near the chip; electrical connecting wires for electrically connecting together the chip and the leads; at least one by-pass connection line formed in correspondence with the main connection line; and by-pass connecting wires for electrically connecting the main connection line near at one end thereof to the by-pass connection line near at one end thereof, and electrically connecting the main connection line near at the other end thereof to the by-pass connection line near at the other end thereof.

36 Claims, 4 Drawing Sheets

RESIN SEALED SEMICONDUCTOR DEVICE HAVING POWER SOURCE BY-PASS CONNECTING LINE

This application is a continuation of application No. 07/790,525, filed Nov. 12, 1991, now abandoned.

FIELD OF THE INVENTION

The present invention relates to a resin sealed semiconductor device which allows a voltage applied to one end of a narrow connection line of the semiconductor chip to propagate correctly to the other end of the line, even if the line, for example, a power supply line, is formed very finely.

BACKGROUND OF THE INVENTION

As a means for electrically connecting a semiconductor element (hereinafter called a chip) to external leads of a semiconductor device having a plurality of terminals or pins, such as ICs and LSIs, there are known wire bonding and wireless bonding methods. The wire bonding method is a method whereby a bonding wire made of a fine metal such as gold and aluminum and having a 20 to 30 μm diameter, connects a bonding pad on a chip to an external lead. Bonding wire is bound, for example, by means of a thermocompression bonding method, an ultrasonic bonding method, or both the methods. The wireless bonding method is a method whereby a plurality of gold pads on a chip are connected to a plurality of external leads at a time using specific bumps or metal leads. This method is executed by a known tape carrier scheme, flip chip scheme, beam lead scheme, or the like. As well known, in order to protect a chip from contamination or defect by ambient atmosphere, the chip and its peripheral area are sealed with resin.

FIG. 1 is a plan view of a chip of a resin sealed semiconductor having a well known zigzag in-line package (ZIP). Referring to FIG. 1, at the peripheral area of a chip 1, there are formed bonding pads 2, a $V_{SS}$ potential bonding pad 3, and a $V_{cc}$ potential bonding pad 4, at positions corresponding to the layout of a lead frame for ZIP. The $V_{SS}$ potential bonding pad 3 is connected to a $V_{SS}$ potential connection line 20 of a closed loop formed at the peripheral area of the chip 1. A $V_{CC}$ potential connection line (not shown) is also formed at the side of the $V_{SS}$ potential connection line, the detailed description of this line being omitted because it is not closely related to the present invention. As described above, a chip has a number of power supply lines and a number of electrodes (bonding pads) for supplying input/output signals and power sources. A connection line, particularly a power source line, occupies a large area of wiring space, providing one of obstacles against high integration of a semiconductor device.

FIG. 2 is a plan view of a conventional lead frame on which the chip shown in FIG. 1 is mounted. A semiconductor mount section (hereinafter called a bed) 5 is formed at the central area of the frame, and leads are formed externally of the bed. Each lead is comprised by an inner lead 9 directly connected to a bonding pad, and an outer lead 8 integrally formed with the inner lead 9. At the tip of the inner lead 9, there is formed a metal plated layer 9A such as gold and silver. One of the inner leads 9 is used as a $V_{SS}$ potential lead 10, and another is used as a $V_{CC}$ potential lead 13.

The bed 5 is suspended by a side section 7 of the lead frame via suspension pins 6. A metal plated layer 5A such as gold and silver is also formed on the surface of the bed 5. Reference numeral 7A represents a hole for transporting the lead frame.

FIG. 3 is a plan view of the finished semiconductor device wherein the chip 1 shown in FIG. 1 and mounted on the lead frame shown in FIG. 2, is sealed with resin and the side section 7 of the lead frame is removed. FIG. 3 is shown as seeing through the resin sealed portion of the semiconductor device. The chip 1 is attached to the bed 5 using mount paste. Next, the bonding pads 2, $V_{SS}$ potential bonding pad 3, and $V_{CC}$ potential bonding pad 4, respectively on the chip 1, are connected to leads 9 (10, 13) using bonding wires 11. Thereafter, the chip 1 is sealed with resin 12 such as epoxy resin, and the leads are cut from the side section and bent. In this manner, the resin sealed semiconductor device is formed, with the side section 7 of the lead frame being removed.

FIG. 4 shows another conventional resin sealed semiconductor device of a thin small out-one package (TSOP) type. FIG. 4 is shown as seeing through resin 12. This device has leads extending from two opposite sides, and suspension pins 6 being formed at the other two opposite sides. These points differ from the device shown in FIGS. 2 and 3.

Recently, semiconductor devices such as ICs and LSIs are becoming more and more integrated, so the number of pads on a chip for supplying input/output signals and power sources is increasing greatly. Furthermore, the chip size is becoming more and more reduced, so the design rule is becoming finer. Therefore, the resistance of a connection line becomes high posing a problem of signal noises.

A connection line, particularly a power source line, occupies most of the chip wiring area. This power source line is therefore becoming more and more fine, resulting in noise generation by power source lines in many cases. For example, the chip 1 shown in FIG. 1 has its $V_{SS}$ potential bonding pad 3 on the A side. Assuming that the pad 3 is connected to the $V_{SS}$ potential side (ground), the $V_{SS}$ potential connection line 20 takes a $V_{SS}$ potential. However, the potential at the B side of the connection line 20 is not $V_{SS}$ in practice. Since the $V_{SS}$ potential connection line is made fine because of high integration of the semiconductor device, the resistance of the $V_{SS}$ potential connection line 20 becomes high. It is a tendency therefore that the potential of the connection line 20 at the B side opposite to the A side becomes higher than $V_{SS}$ potential. More specifically, if the connection line width becomes equal to or less than about 100 μm, the $V_{SS}$ potential rises about 0.1 V from 0 V. Accordingly, noises are superposed upon input/output signals within a chip, posing the problem that operation speed cannot be made high.

The above problem can be solved if, for example, the $V_{SS}$ potential is supplied to both sides of a chip, at the areas near the A and B sides. However, from the viewpoint of package lead frame designs, it is impossible to increase the number of $V_{SS}$ leads.

As described above, semiconductor devices are becoming more and more integrated, so the design rule is becoming finer. Therefore, the resistance of a connection line becomes high posing a problem of signal noises.

SUMMARY OF THE INVENTION

The present invention has been made in consideration of the above-described circumstances. It is an object of the present invention to provide a semiconductor device having a wiring structure capable of reducing a potential fluctuation of a connection line, e.g., a power source line, and hence eliminating noise generation.

According to the present invention, a lead is provided outside of a chip, the lead serving to by-pass the potential of a connection line, e.g., a power source line. With such an arrangement, irrespective of an increased resistance of a fine connection line in a highly integrated chip, the potential can be correctly propagated within the chip. Therefore, the potential fluctuation within the chip can be suppressed, solving the problem of noise generation and ensuring the performance specific to the chip.

BRIEF DESCRIPTION OF THE DRAWINGS

FIG. 3 is a plan view of a conventional resin sealed semiconductor device of a ZIP type, with the resin portion being seen through;

FIG. 4 is a plan view of a conventional resin sealed semiconductor device of a TSOP type, with the resin portion being seen through;

FIG. 6 is a plan view of a resin sealed semiconductor device using the lead frame of the first embodiment, with the resin portion being seen through;

DESCRIPTION OF THE PREFERRED EMBODIMENTS

The embodiments of the present invention will be described with reference to the accompanying drawings.

The first embodiment will be described.

Figure 5:
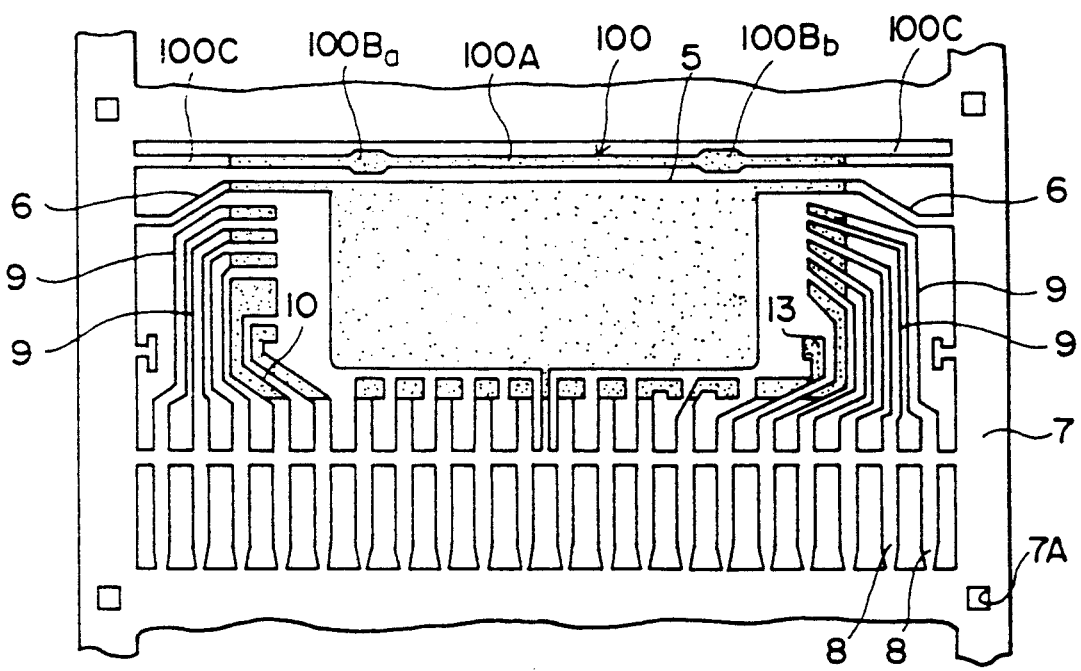
FIG. 5 is a plan view of a lead frame according to a first embodiment of the present invention.
Figure 6:
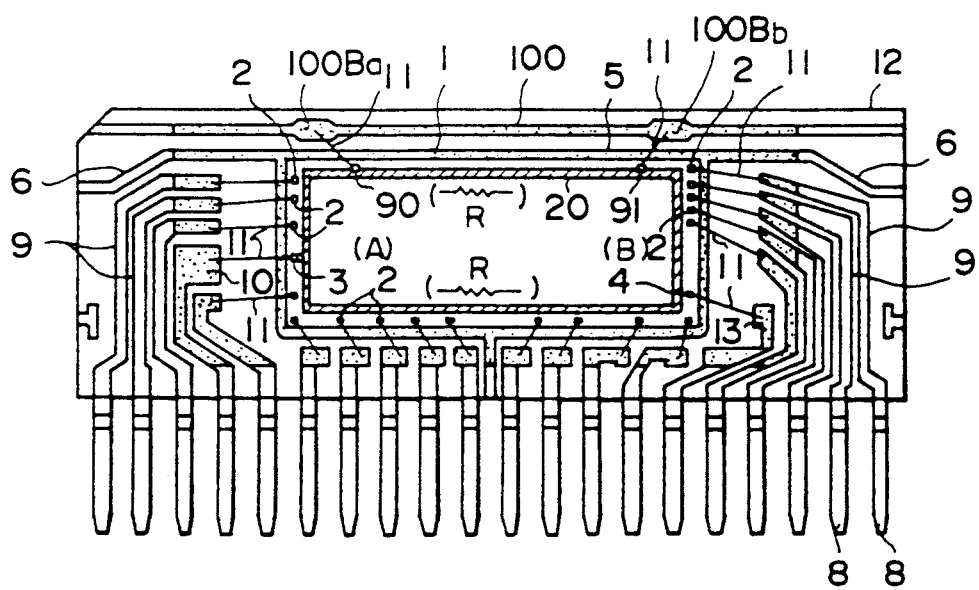
Figure 7:
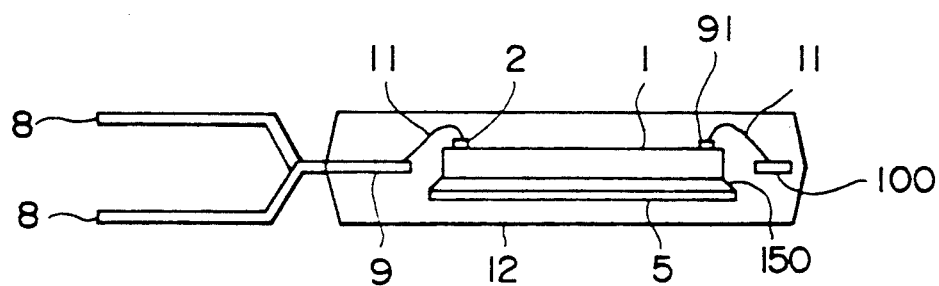
FIG. 7 is a see-through side view of FIG. 6.

FIG. 5 is a partial plan view of a lead frame for a ZIP type according to the present invention. FIG. 6 shows a resin sealed chip mounted on the lead frame shown in FIG. 5. FIG. 6 is shown as seeing through the resin portion. FIG. 7 is a side view of FIG. 6 with resin being seen through.

Figure 1:
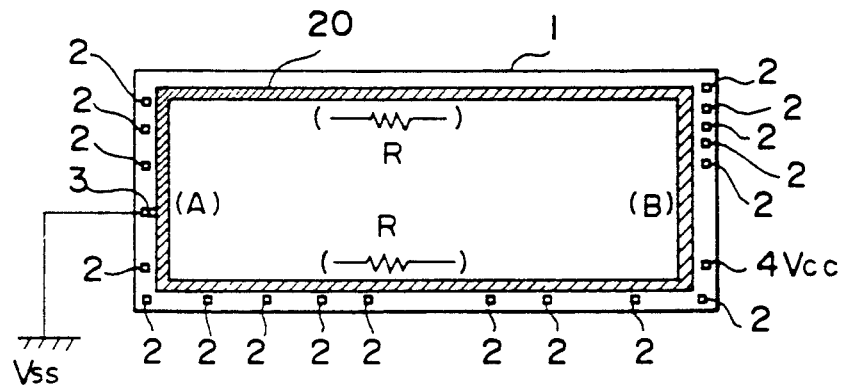
FIG. 1 is a plan view of a conventional chip of a ZIP type.
Figure 2:
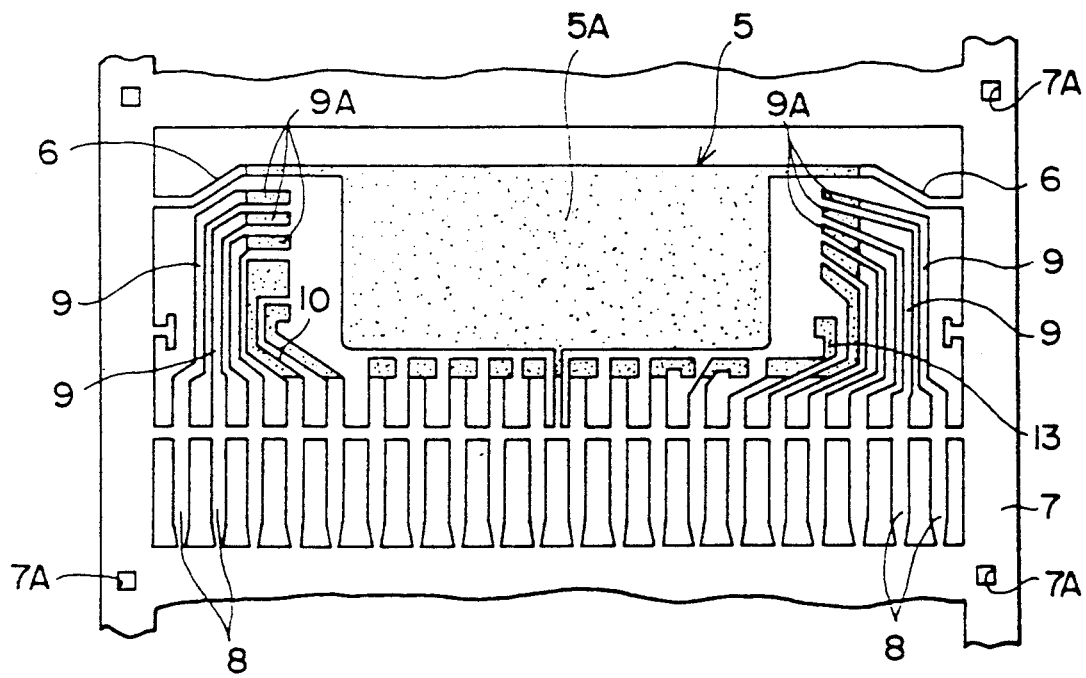
FIG. 2 is a plan view of a conventional lead frame used for a semiconductor device of a ZIP type.
Figure 3:
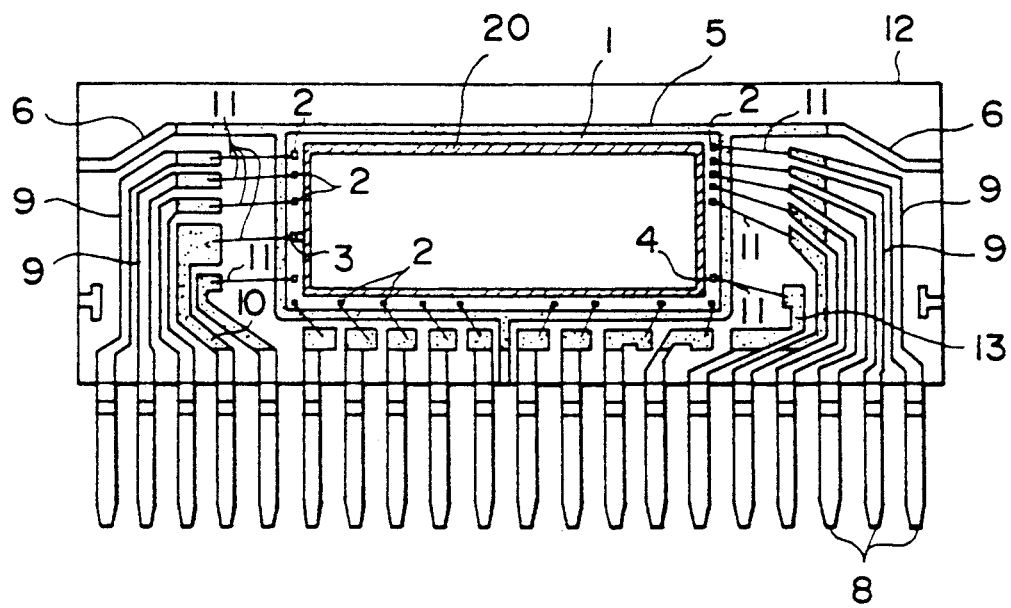
Figure 4:
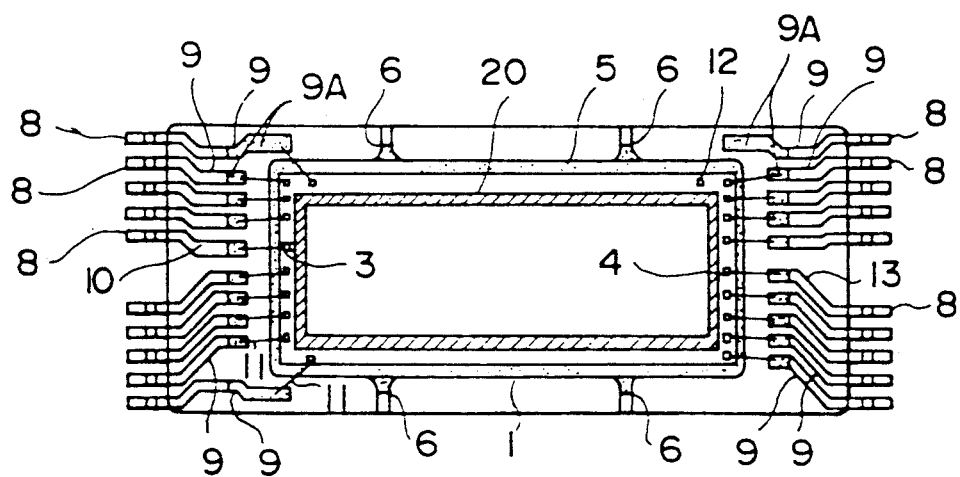

In the lead frame shown in FIG. 5, like elements to the conventional lead frame shown in FIG. 2 are represented by using identical reference numerals, and the description thereof is omitted.

A by-pass lead 100 which is a characteristic feature of the present invention is formed at an upper area of a bed 5. The surface of the by-pass lead 100 is also coated with a metal plated layer 100A. The lead 100 has two bonding areas 100$B_a$ and 100$B_b$ at slightly inner positions thereof. The bonding areas 100$B_a$ and 100$B_b$ are used for wire bonding, and are wider than other areas 100C of the lead 100. The width of the narrower area 100C of the lead 100 is about 0.2 mm. This width may be about 0.1 mm to 2 mm.

A chip is mounted on the lead frame shown in FIG. 5 and sealed with resin. As particularly shown in FIG. 7, a chip 1 is fixedly mounted on the bed 5 using conductive adhesive agent 150 such as epoxy resin contained with silver. The adhesive agent is not necessarily conductive, but may be an insulator, for example, using only epoxy resin. As seen from FIG. 6, the chip 1 mounted on the bed 5 is slightly different from a conventional chip. Namely, there are formed two bonding pads 90 and 91 on a $V_{SS}$ potential connection line 20, the bonding pads 90 and 91 being connected to the bonding areas 100B of the by-pass lead 100 by bonding wires 11. Bonding wires 11 for electrical connection between the leads 100 and chip 1 are made of material such as gold and aluminum. Bonding wires 11 made of material such as gold and aluminum also provide connections between the bonding pads 2 on the chip 1 and inner leads 9, between a $V_{SS}$ potential bonding pad 3 and a $V_{SS}$ potential lead 10, and between a $V_{CC}$ potential bonding pad 4 and a $V_{CC}$ potential lead 13. As the bonding technique, a desired one of known methods such as ultrasonic bonding and thermocompression bonding may be used. Thereafter, the chip 1 is sealed with resin 12 such as epoxy resin. Then, leads are cut and bent to obtain a resin sealed semiconductor device shown in FIGS. 6 and 7, with a side section 7 of the lead frame being removed.

According to the first embodiment, the $V_{SS}$ potential supplied to one side of the chip 1 in the lateral direction is propagated to the other side via the by-pass lead 100 formed above the bed 5. More particularly, the $V_{SS}$ potential is propagated via the route of the $V_{SS}$ potential lead 10, bonding wire 11, $V_{SS}$ potential bonding pad 3, $V_{SS}$ potential connection line 20, bonding pad 90 on the $V_{SS}$ potential connection line 20, bonding wire 11, bonding area 100$B_a$, by-pass lead 100, bonding area 100$B_b$, bonding wire 11, and bonding pad 91 on the $V_{SS}$ potential connection wire 20. In this manner, the $V_{SS}$ potential can be propagated from the A side to B side of the $V_{SS}$ potential connection line 20, without the influence of the resistance of the connection line 20. Therefore, potential fluctuation within a chip, which has been the conventional problem, will not occur. Furthermore, since the by-pass lead 100 can be formed at the marginal area of the lead frame, the device will not be prevented from being made finer by the presence of the by-pass lead.

The second embodiment will be described which uses two by-pass leads.

Figure 8:
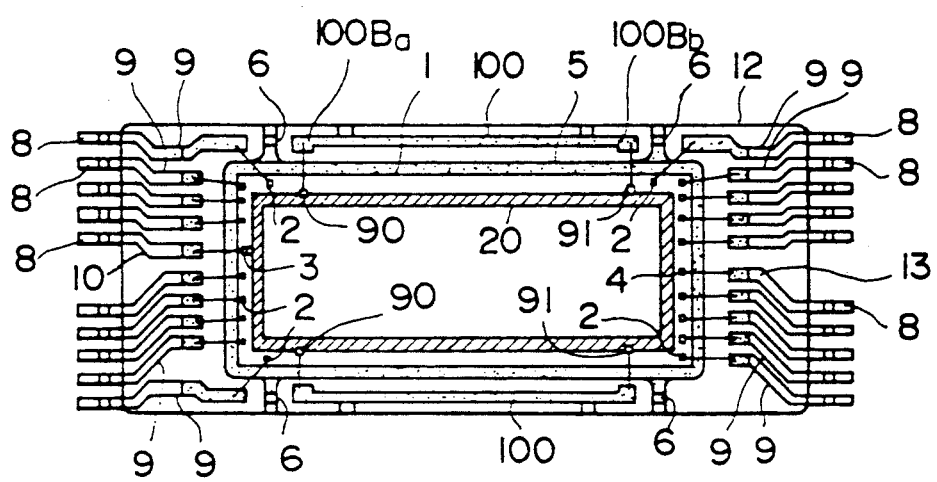
FIG. 8 is a see-through plan view of a lead frame according to the second embodiment.
Figure 9:
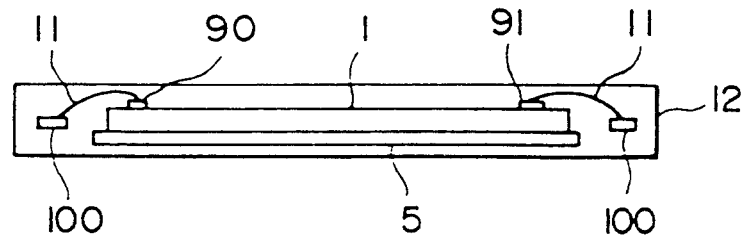
FIG. 9 is a see-through side view of FIG. 8.

FIG. 8 shows a resin sealed semiconductor device of a thin small out-line package (TSOP). FIG. 8 shows a plan view of the device with a chip mounted on a lead frame and sealed with resin, with the resin portion being seen through. In FIGS. 8 and 9, like elements to those shown in FIGS. 5 to 7 are represented by using identical reference numerals. A lead frame (not shown) used with this semiconductor device has leads 8 and 9 formed on the right and left sides as shown in FIG. 8. A pair of suspension pins 6 is formed at the upper and lower portions. In this embodiment, two by-pass leads 100 are formed at the areas between the two pairs of suspension pins 6.

The $V_{SS}$ potential supplied from a $V_{SS}$ lead 10 is propagated in the similar manner to the first embodiment. Specifically, the $V_{SS}$ potential is propagated via the route of the $V_{SS}$ lead 10, bonding wire 11, pad 3, connection line 20, pad 90, wire 11, bonding area 100$B_a$, lead 100, bonding area 100$B_b$, wire 11, and pad 91.

The number of by-pass leads is not limited, but any necessary number of leads may be used.

The material of a lead frame is not specifically limited. As the material, in addition to an Fe-42 Ni alloy (42 alloy), other metals such as copper may be used.

As the semiconductor of a chip, in addition to silicon (Si), Ge and compound semiconductor such as GaAs and InP may be used.

The width and length of a by-pass lead may be set as desired while considering the advantageous effects of the present invention. For example, in the first embodiment, the length of the by-pass lead is substantially the same as the semiconductor device (whose size is about 5×15 mm).

In the first and second embodiments, there is used a lead frame of the type that bonding wires are used for electrical connection between inner leads and bonding pads of a chip. However, the present invention is not limited to this type. For example, the film carrier method may be used whereby inner leads are directly connected to bonding pads of a chip. The scope of the present invention obviously contains this method.

According to the present invention, power source lines can be made finer at the stage of designing a chip, which is very efficient in reducing the chip size.

The package type is not limited to TSOP and ZIP, but other types such as DIP and SOJ may also be used.

What is claimed is:

1. A resin sealed semiconductor device comprising:
    a semiconductor chip having an electric circuit therein and an elongated power source connection line respectively formed thereon;
    a plurality of leads disposed near said chip;
    electrical connecting means for electrically connecting together said chip and said leads;
    at least one by-pass connecting line formed in correspondence with said power source connection line; and
    by-pass connecting means for electrically connecting said power source connection line near at one end thereof to said by-pass connection line near at the corresponding end thereof, and electrically connecting said power source connection line near at the other end thereof to said by-pass connection line near at the corresponding end thereof.

2. A device according to claim 1, wherein at least one of said leads is electrically connected to said power source connection line by said electrical connecting means.

3. A device according to claim 2, wherein pads connected to said electric circuit are formed on the surface of said chip, and each of said pads is connected to one end of said electrical connecting means.

4. A device according to claim 2, wherein said at least one of said leads electrically connected to said power source connection line is connected to a lower power source.

5. A device according to claim 2, wherein said by-pass connection lien is formed in parallel with said power source connection line.

6. A device according to claim 4, wherein said by-pass connection line is formed in parallel with said power source connection line.

7. A device according to claim 5, wherein said power source connection line is formed of a closed loop shape.

8. A device according to claim 6, wherein said power source connection line is formed of a closed loop shape.

9. A device according to claim 5, wherein there is provided one line of said by-pass connection line.

10. A device according to claim 6, wherein there is provided one line of said by-pass connection line.

11. A device according to claim 9, wherein said by-pass connection line has wider areas near at opposite ends thereof, one of said wider areas being connected to said power source connection line at one end portion thereof by said by-pass connecting means and the other of said wider areas being connected to said power source connection line at the other end portion thereof by said by-pass connecting means.

12. A device according to claim 10, wherein said by-pass connection line has wider areas near at opposite ends thereof, one of said wider areas being connected to said power source connection line at one end portion thereof by id by-pass connecting means, and the other of said wider areas being connected to said power source connection line at the other end portion thereof by said by-pass connecting means.

13. A device according to claim 5, wherein there are provided two lines of said by-pass connection line.

14. A device according to claim 6, wherein there are provided two lines of said by-pass connection line.

15. A device according to claim 13, wherein said by-pass connection line has wider areas near at opposite ends thereof, one of said wider areas being connected to said power source connection line at one end portion thereof by by-pass connecting means, and the other of said wider areas being connected to said power source connection line at the other end portion thereof by said by-pass connecting means.

16. A device according to claim 14, wherein said by-pass connection line has wider areas near at opposite ends thereof, one of said wider areas being connected to said power source connection line at one end portion thereof by said by-pass connecting means, and the other of said wider areas being connected to said power source connection line at the other end portion thereof by said by-pass connecting means.

17. A device according to claim 11, wherein said chip is mounted on a bed.

18. A device according to claim 12, wherein said chip is mounted on a bed.

19. A device according to claim 15, wherein said chip is mounted on a bed.

20. A device according to claim 16, wherein said chip is mounted on a bed.

21. A resin sealed semiconductor device having a power source by-pass connecting line comprising:
    a semiconductor chip having an electric circuit therein and an elongated power source connecting line respectively formed thereon;
    a plurality of leads arranged near said chip;
    electrical connecting means for electrically connecting together said chip and said leads;
    at least one by-pass connecting line formed in correspondence with said power source connecting line, said by-pass connecting line being arranged at the side of the semiconductor chip; and
    by-pass connecting means for electrically connecting said power source connecting line near at one end thereof to said by-pass connecting line near at the corresponding end thereof, and electrically connecting said power source connecting line near at the other end thereof to said by-pass connecting line near at the corresponding end thereof.

22. A device according to claim 21, wherein said at least one by-pass connecting line and said semiconductor chip are arranged in the same plane.

23. A device according to claim 21, wherein said at least one by-pass connecting line is arranged in the area where said leads are not arranged.

24. A device according to claim 22, wherein said at least one by-pass connecting line is arranged in the area where said leads are not arranged.

25. A device according to claim 23, wherein said leads are arranged at three sides of said semiconductor chip, and one by-pass connecting line is arranged at the remaining side of said semiconductor chip.

26. A device according to claim 24, wherein said leads are arranged at three sides of said semiconductor chip, and one by-pass connecting line is arranged at the remaining side of said semiconductor chip.

27. A device according to claim 23, wherein said leads are arranged at first opposite sides of said semiconductor chip and two by-pass connecting lines are arranged at second opposite sides, an opposing direction of said opposite sides being perpendicular to an opposing direction of said second opposite sides.

28. A device according to claim 24, wherein said leads are arranged at first opposite sides of said semiconductor chip and two by-pass connecting lines are arranged at second opposite sides, an opposing direction of said first opposite sides being perpendicular to an opposing direction of said second opposite sides.

29. A device according to claim 21, wherein said by-pass connecting line has wider areas near at opposite ends thereof, one of said wider areas being connected to said main connecting line at one end portion thereof by said main connecting line at one end portion thereof by said by-pass connecting means, and the other of the said wider areas being connected to said main connecting line at the other end portion thereof by said by-pass connecting means.

30. A device according to claim 22, wherein said by-pass connecting line has wider areas near at opposite ends thereof, one of said wider areas being connected to said main connecting line at one end portion thereof by said by-pass connecting means, and the other of said wider areas being connected to said main connecting line at the other end portion thereof by said by-pass connecting means.

31. A device according to claim 23, wherein said by-pass connecting line has wider areas near at opposite ends thereof, one of said wider areas being connected to said main connecting line at one end portion thereof by said by-pass connecting means, and the other of said wider areas being connected to said main connecting line at the other end portion thereof by said by-pass connecting means.

32. A device according to claim 24, wherein said by-pass connecting line has wider areas near at opposite ends thereof, one of said wider areas being connected to said main connecting line at one end portion thereof by said by-pass connecting means, and the other of said wider areas being connected to said main connecting line at the other end portion thereof by said by-pass connecting means.

33. A device according to claim 21, wherein both said leads and said at least one by-pass connecting line formed by cutting one lead frame plate are arranged in the same plane.

34. A device according to claim 22, wherein both said leads and said at least one by-pass connecting line formed by cutting one lead frame plate are arranged in the same plane.

35. A device according to claim 23, wherein both said leads and said at least one by-pass connecting line formed by cutting one lead frame plate are arranged in the same plane.

36. A device according to claim 24, wherein both said leads and said at least one by-pass connecting line formed by cutting one lead frame plate are arranged in the same plane.

* * * * *